United States Patent [19]

Metzger et al.

[11] Patent Number: 5,747,418
[45] Date of Patent: May 5, 1998

[54] SUPERCONDUCTING THERMOELECTRIC GENERATOR

[75] Inventors: John D. Metzger, Eaton's Neck, N.Y.; Mohamed S. El-Genk, Albuquerque, N. Mex.

[73] Assignee: The United States of America as represented by the United States Department of Energy, Washington, D.C.

[21] Appl. No.: 732,945

[22] Filed: Oct. 17, 1996

Related U.S. Application Data

[63] Continuation-in-part of Ser. No. 336,050, Nov. 4, 1994, abandoned, which is a continuation-in-part of Ser. No. 43,457, Apr. 6, 1993, abandoned, which is a continuation-in-part of Ser. No. 841,169, Feb. 25, 1992, abandoned.

[51] Int. Cl.$^6$ .................. H01L 39/06; H01L 39/22; H01L 35/04; H01L 35/14
[52] U.S. Cl. .................. 505/160; 505/161; 505/163; 505/191; 505/235; 505/330; 505/701; 505/875; 505/876; 505/891; 136/200; 136/201; 136/205; 136/224; 136/225; 136/228; 136/236.1; 136/238
[58] Field of Search .................. 136/200, 201, 136/205, 224, 225, 228, 236.1, 238; 505/160, 161, 163, 191, 235, 330, 701, 875, 876, 891

[56] References Cited

U.S. PATENT DOCUMENTS

| | | | |
|---|---|---|---|
| 3,256,696 | 6/1966 | Henderson | 62/3 |
| 3,416,971 | 12/1968 | Hutkin | 136/205 |
| 3,593,110 | 7/1971 | Huebener | 322/2 |
| 3,664,143 | 5/1972 | Carroll | 62/3 |
| 4,292,579 | 9/1981 | Constant | 322/2 R |
| 4,362,023 | 12/1982 | Falco | 62/3 |
| 4,368,416 | 1/1983 | James | 322/2 R |
| 4,503,447 | 3/1985 | Iafrate et al. | 357/16 |
| 4,833,050 | 5/1989 | Whitney et al. | 429/194 |
| 4,973,874 | 11/1990 | Carr, Jr. | 310/306 |
| 4,988,669 | 1/1991 | Dersch | 505/1 |
| 5,006,505 | 4/1991 | Skertic | 505/1 |
| 5,057,490 | 10/1991 | Skertic | 505/1 |
| 5,288,336 | 2/1994 | Stachan et al. | 136/200 |
| 5,421,828 | 9/1993 | Kapitulnik | 62/3.2 |

FOREIGN PATENT DOCUMENTS

| | | | |
|---|---|---|---|
| 64-9671 | 1/1989 | Japan | 136/200 |
| 1-248574 | 10/1989 | Japan | 136/200 |

*Primary Examiner*—Kathryn L. Gorgos
*Assistant Examiner*—Chrisman D. Carroll
*Attorney, Agent, or Firm*—Harold M. Dixon; William R. Moser; Paul A. Gottlieb

[57] ABSTRACT

An apparatus and method for producing electricity from heat. The present invention is a thermoelectric generator that uses materials with substantially no electrical resistance, often called superconductors, to efficiently convert heat into electrical energy without resistive losses. Preferably, an array of superconducting elements is encased within a second material with a high thermal conductivity. The second material is preferably a semiconductor. Alternatively, the superconducting material can be doped on a base semiconducting material, or the superconducting material and the semiconducting material can exist as alternating, interleaved layers of waferlike materials. A temperature gradient imposed across the boundary of the two materials establishes an electrical potential related to the magnitude of the temperature gradient. The superconducting material carries the resulting electrical current at zero resistivity, thereby eliminating resistive losses. The elimination of resistive losses significantly increases the conversion efficiency of the thermoelectric device.

21 Claims, 2 Drawing Sheets

SUPERCONDUCTING THERMOELECTRIC GENERATOR

BACKGROUND OF THE INVENTION

1. Field of the Invention

This application is a continuation-in-part of application Ser. No. 08/336,050, filed Nov. 4, 1994, now abandoned, which is a continuation-in-part of application Ser. No. 08/043,457, filed Apr. 6, 1993, now abandoned, which is a continuation-in-part of application Ser. No. 07/841,169, filed Feb. 25, 1992, now abandoned.

The United States Government has rights in this invention pursuant to Contract No. DE-AC09-89SR18035 between the U.S. Department of Energy and Westinghouse Savannah River Company.

The present invention relates to thermoelectric energy generation. More particularly, the present invention relates to the conversion of heat into electrical energy using superconducting materials, thus maximizing thermoelectric conversion efficiency.

2. Discussion of Background

Thermoelectricity is produced by applying a temperature differential to dissimilar electrically conducting or semiconducting materials, thereby producing a voltage that is proportional to the temperature difference. Thermoelectric generators use this effect to directly convert heat into electricity; however, presently-known generators have low efficiencies due to the production of high currents which in turn cause large resistive heating losses. Some thermoelectric generators operate at efficiencies between 4% and 7% in the 800° to 1200° C. range.

The power output of a thermoelectric generator is proportional to the merit factor Z:

$$Z = S^2/\rho K,$$

where S is the Seebeck coefficient, $\rho$ the electrical resistivity and K the thermal conductivity of the thermoelectric material. The greater the merit factor, the greater the output (heating, cooling, power generation) that can be obtained from the material for a given energy input. A significant problem in the development of more efficient thermoelectric generators is the lack of materials that simultaneously exhibit high Seebeck coefficients, low electrical resistivities and low thermal conductivities, and therefore, high merit factors.

Meanwhile, development of materials that have virtually no electrical resistance over a temperature range, often called "superconductors", is underway for applications related to conducting electricity. The electrical resistivity of a superconductor is essentially zero at temperatures below a critical temperature $T_c$ (also called the transition temperature), thus, superconductors conduct electricity substantially without resistance in the temperature range below the critical temperature. The critical temperature depends on the particular material. Metals typically have low critical temperatures ($T_c$=1.2 K for Al and 7.2 K for Pb). However, materials are known that have critical temperatures exceeding 80 K, for example, $YBa_2Cu_3O_7$, 90K; $Bi_2BaCu_2O_8Sr_2$, 110 K; $Tl_2Ba_2CaCu_2O_8$, approximately 120 K. However, commercial applications for superconductors are severely limited because most presently available superconductors must be maintained at very low temperatures in order to conduct electricity substantially without resistance.

Several types of thermoelectric applications exist. Hutkin, U.S. Pat. No. 3,416,971, discloses a thermal-activated battery featuring a bundled arrangement of filamentary thermal cells. A glass coating existing between the conductive core and sheath of each thermal cell is ionically conductive at a particular operating temperature range. Electrical energy is generated when the thermal cells are heated to within this range. Henderson, U.S. Pat. No. 3,256,696, discloses semiconductor materials composed of compounds or combinations of compounds that exhibit high Z factors due to high Seebeck coefficients and negative coefficients of resistivity. Henderson also discloses the thermoelectric use of these specific compounds.

Regarding superconducting applications, Dersch, U.S. Pat. No. 4,988,669, discloses a multiple-filament cable partially containing superconducting material. Each of the filaments contains a core of high-temperature ceramic superconducting material. The superconducting material is a composite made of a rare earth/Ba/Cu/O type that have critical temperatures above 50 K. Carr, U.S. Pat. No. 4,973,874, discloses the use of superconducting materials in conjunction with ferromagnetic materials in a flux pump to generate electrical energy. Also, Whitney, et al., U.S. Pat. No. 4,833,050, disclose the possible use of superconducting material in an electrochemical cell.

It is believed that none of the prior art discloses the use of superconducting materials in thermoelectric energy generation. Using superconducting materials within thermoelectric generators would significantly increase the efficiency of these devices in converting heat energy to electrical energy.

SUMMARY OF THE INVENTION

According to its major aspects and broadly stated, the present invention is an apparatus and method for producing electricity from heat. In particular, the invention is a thermoelectric generator that juxtaposes a superconducting material and a semiconducting material—so that the superconducting and the semiconducting materials touch—to convert heat energy into electrical energy without resistive losses in the temperature range below the critical temperature of the superconducting material. Preferably, an array of superconducting material is encased in one of several possible configurations within a second material having a high thermal conductivity, preferably a semiconductor, to form a thermoelectric generator.

By way of example, the superconducting material, such as $[La_{1-x}M_x]_2CuO_4$ where M is Ba, Sr, or Ca, can be a dopant added to a base material that is also a superconducting material but that is also a semiconductor, such as $La_2CuO_4$. The thermoelectric generator can be configured as alternating wafers of superconducting material and semiconducting material or as rods in a matrix.

When a temperature gradient is imposed across the boundary of the two materials, an electrical potential proportional to the magnitude of the temperature gradient is established between the two materials. At temperatures below its critical temperature, the superconducting material carries the resulting electrical current substantially without resistance, thereby largely eliminating resistive heat losses and significantly increasing the conversion efficiency of the thermoelectric device.

A major feature of the present invention is the use of superconducting materials—materials that exhibit substantially no electrical resistance within a specified temperature range, i.e., at temperatures below the critical temperature—for the conductor and possibly also the semiconductor. The advantage of this feature is that thermoelectric conversion efficiency of the present invention is maximized. The electrical energy produced from the conversion of heat can be extracted from the thermoelectric generator without significant resistive losses. Existing electrical devices, using semiconductors or thermoelectric alloy materials, suffer from significant resistive losses due to the resistance of the materials in use and the large currents that are produced during operation. Furthermore, because resistance in a conductor produces heat, the absence of resistance in the superconducting materials makes it easier to maintain the operating temperature range and the temperature gradient across their boundaries. Finally, although superconducting materials that require very cold operating temperatures may be selected for use with the present invention, the efficiency will be increased because of low sink temperature.

Another feature of the present invention is the encasing of an array of superconducting material within a material with a high thermal conductivity, preferably a semiconductor material. This feature facilitates efficient conversion of heat into electrical energy. The thermally conductive material provides the necessary heat conductance efficiently while the superconducting material carries the converted electrical energy at essentially zero resistance. The above-described embodiments of the present invention, a semiconductor material doped with superconductor materials, the rods in a matrix and alternating wafers of semiconductors and superconductors, will not completely eliminate energy losses, but will greatly reduce them.

Other features and advantages of the present invention will be apparent to those skilled in the art from a careful reading of the Detailed Description of a Preferred Embodiment presented below and accompanied by the drawings.

DETAILED DESCRIPTION OF A PREFERRED EMBODIMENT

Figure 1:
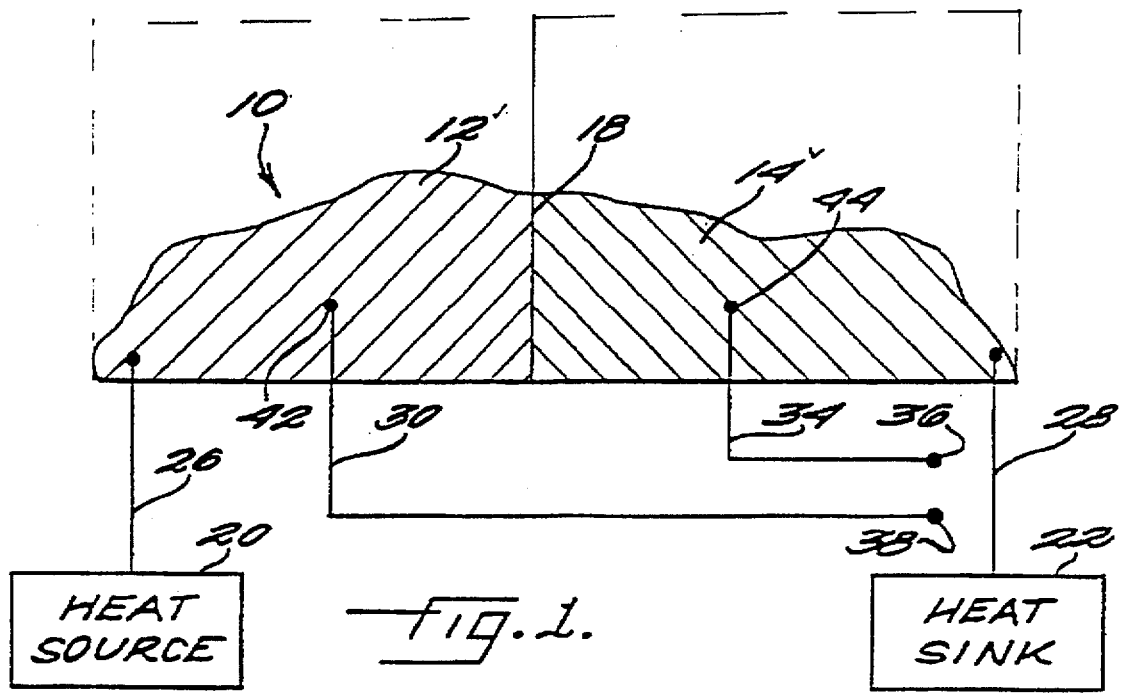
FIG. 1 is a simplified, partial cross-sectional view of a thermoelectric generation configuration according to a theoretical embodiment of the prior art.

Referring now to FIG. 1, a thermoelectric device 10 consists of a first conductor 12 adjacent to a second conductor 14 so that a contiguous boundary 18 exists between two materials. Conductors 12 and 14 are thermoelectric materials, that is, materials that can be used to convert thermal energy into electric energy or provide refrigeration directly from electric energy. Conductors 12 and 14 are typically made of electrically conducting or semiconducting materials such as geranium telluride, bismuth telluride, cesium sulfide, and so forth.

In the present invention, at least one of conductors 12 and 14 is made of a material that has substantially no electrical resistance (i.e., essentially zero electrical resistivity and essentially infinite electrical conductivity) at temperatures below a critical temperature $T_c$. Such materials, known as superconductors, typically have 3, 5, or 7 valence electrons per atom. Superconducting metals typically have critical temperatures less than 10 K; however, many materials with higher critical temperatures are known. By way of example, $Ba_2Cu_3LaO_6$, $T_c=80$ K; $YBa_2Cu_3O_7$, $T_c$, $T_c=90$ K; $Bi_2CaCu_2O_8Sr_2$, $T_c=110$ K; and $Ba_2CaCu_2O_8Tl_2$, $T_c=120$. Other materials suitable for use with the invention include $[La_{1-x}M_x]_2CuO_4$ where M is Ba, Sr or C and $0 \leq x \leq 1$; superconductors of the types $(La, Ba)_2CuO_4$ and $(La, Ba, Sr)_2CuO_4$; and superconductors of the type $RBa_2Cu_3O_x$, where R is at least one rare earth metal and x is a finite number (for example, $YBa_2Cu_3O_x$). Rare earths are those elements having atomic numbers from 57 to 71 inclusive. A listing of superconductors is found on pages 12–28 to 12–53 of the CRC Handbook of Chemistry and Physics, 71st Edition (1990), which material is incorporated herein by reference.

Semiconductor materials are preferred for transferring heat because they are a good compromise between conductors and insulators. Insulators have the highest Seebeck coefficients and the lowest thermal conductivities; conductors such as metals have lowest Seebeck coefficients and the highest thermal conductivities. Semiconductors fall between the two, especially at low and room temperatures. Semiconductors have electrical resistivities between the resistivities of metals and insulators, typically electrical resistivities in the range of $10^{-2}$ to $10^9$ ohms/cm. Semiconductors suitable for use with the invention have a higher thermal conductivity than the superconducting material. Suitable semiconductors include bismuth telluride, bismuth antimony, and $La_2CuO_4$; however, the optimum semiconductor/superconductor combination is best selected by a modest degree of experimentation for each particular application. Properties of some known semiconductors are listed on pages 12–23 to 12–27, 12–54 to 12–63, and 12–122 of the CRC Handbook of Chemistry and Physics, 71st Edition (1990), which material is incorporated herein by reference.

Heat source 20 and heat sink 22 provide a means for imposing a temperature gradient across boundary 18 defined by the portions of conductors 12 and 14 that are "touching" or in contact with each other. The portions of conductors 12, 14 that are "touching" or in contact with each other to form boundary 18 will typically have the same length. Thus, boundary 18 will be a substantial boundary that maximizes heat conduction between conductors 12, 14, which is beneficial for reasons discussed in the next paragraph below. The substantial boundaries between conductors 12, 14 according to the invention are quite different from the much smaller contact boundaries found in other superconductor approaches, such as, U.S. Pat. Nos. 5,006,505 and 5,057,490, to Matthew M. Skertic. Heat source 20 is thermally connected to one of conductors 12 and 14 by a thermally conducting connecting means 26, such as a wire, working fluid or heat tube. Heat sink 22 is thermally connected to the other of conductors 12 and 14 with a second thermally conducting connecting means 28, which may also be a wire, working fluid or heat tube. Although FIG. 1 shows heat source 20 connected to conductor 12 and heat sink 22 connected to conductor 14, a temperature gradient across boundary 18, but in the opposite direction, will be imposed if the respective connections are reversed.

Conductors 12 and 14 touch each other so that a contiguous boundary is established therebetween. Conductors 12 and 14 are in thermal contact with each other across boundary 18, resulting in a very large thermal contact area between the materials of the conductors and maximizing heat conduction therebetween. This adjacent relationship results in a very large thermal contact area between conductors 12 and 14, greatly reducing energy losses and improving the efficiency of the generator. The temperature difference within the desired operating temperature range imposed across boundary 18 establishes an electrical potential difference between conductors 12 and 14 that is based on their composition and the magnitude of the temperature difference. A set of electrical connections 30 and 34 to conductors 12 and 14, respectively, provides a means for extracting the electrical potential induced by the temperature gradient.

In typical thermoelectric generators, the electrical resistance of the conductors coupled with the large electrical currents that are generated produces significant resistive heat losses that lower the electrical potential that can be extracted. Therefore, the electrical potential across a set of terminals 36 and 38 would be significantly lower than the electrical potential existing across a set of terminals 42 and 44.

In the present invention, at least one of conductors 12 and 14 is a superconducting material, thereby virtually eliminating resistive losses within device 10 when device 10 is at a temperature below the critical temperature. Therefore, during operation of the present invention, the electrical potential across terminals 36 and 38 will be substantially the same as the potential across terminals 42 and 44.

Figure 2:
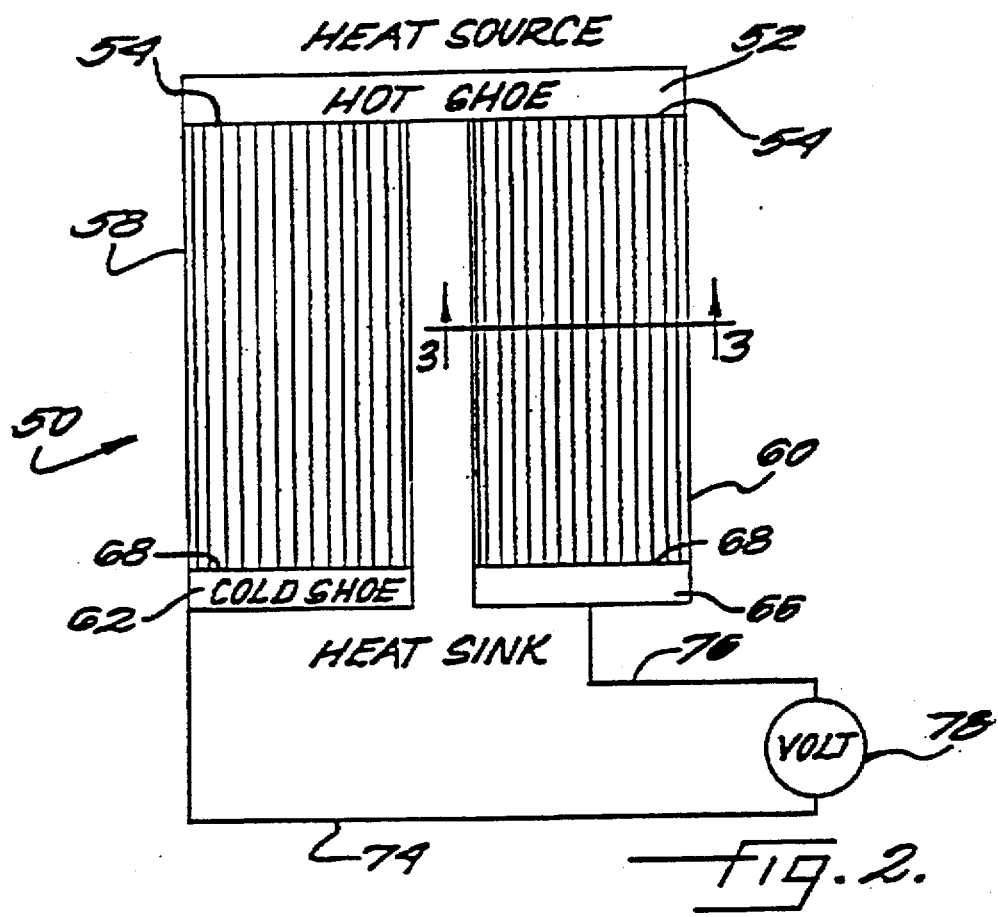
FIG. 2 is a cross-sectional view of a thermoelectric generation configuration according to a preferred embodiment of the present invention.

Referring now to FIG. 2, there is shown a preferred embodiment of a thermoelectric generation device 50 according to the present invention. Device 50 consists of a hot shoe 52 in thermal contact with a heat source and directly connected to an end 54 of configured conductors 58 and 60. A set of cold shoes 62 and 66 are directly connected to another end 68 of configured conductors 58 and 60. Thus, hot shoe 52 is in thermal contact with end 54; cold shoes 62 and 66 are in thermal contact with end 68. A set of electrical connections 74 and 76 attached to cold shoes 62 and 66 provides a means for extracting the electric potential induced by the temperature gradient existing within configured conductors 58 and 60. A voltmeter 78 can be connected to the set of electrical connections 74 and 76 to determine the magnitude of the voltage potential induced.

Figure 3:
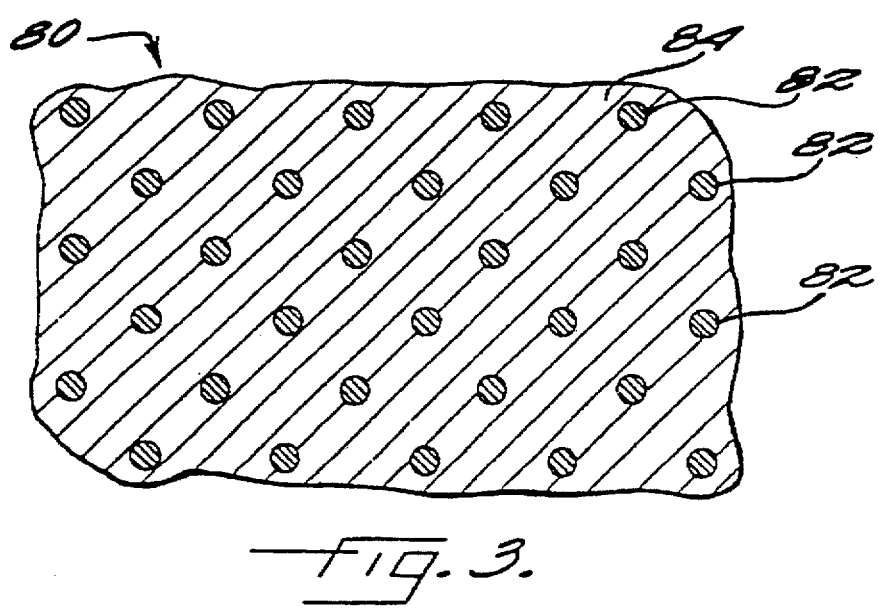
FIG. 3 is a partial cross-sectional view of the thermoelectric generation configuration of FIG. 2, taken along line 3—3.

Configured conductors 58, 60 may each take the form of a thermoelectric device 80, shown in cross-section in FIG. 3. Device 80 is configured so that a first conductor 82 exists as an array of discrete, spaced-apart, superconducting elements running from the hot shoe to the cold shoe (see FIG. 2), preferably in parallel, and encased within a second conductor 84. Thus, the surfaces of conductors 82 and 84 engage each other throughout the length of device 80. That is, each of conductors 82, 84 have the same length and the contact boundary formed between these two conductors is substantial and extends along that entire length, thus maximizing the heat transfer boundary. First conductor 82 is made of a superconducting material that conducts electricity substantially without resistance below a critical temperature $T_c$. Second conductor 84 may also be a superconducting material. However, second conductor 84 must always have a higher thermal conductivity than first conductor 82 so that all or most of the heat is preferentially conducted through conductor 84 to prevent heat from being conducted by the superconducting material (if the temperature of conductor 82 arises above $T_c$, first conductor 82 is no longer superconducting and reverts to its normal conducting state). At temperatures below its critical temperature, first conductor 82 has substantially zero resistivity and carries electrical current with substantially no electrical energy loss.

The advantage of the configuration of device 80 is that the boundary area between conductor 82 and conductor 84, and the overall size of the device, can be substantially increased without significantly increasing the distance heat must travel through the materials to reach the boundary. Thus, the temperature provided by a heat source does not have to be significantly higher than that which is needed to establish the desired temperature gradient.

First conductor 82 can take the form of a dopant added to a base material that forms second conductor 84. In this embodiment, the material of second conductor 84 is a semiconductor and also a superconductor, such as $La_2CuO_4$. The superconducting material of first conductor 82 is a material such as $[La_{1-x}M_x]_2CuO_4$.

Figure 4:
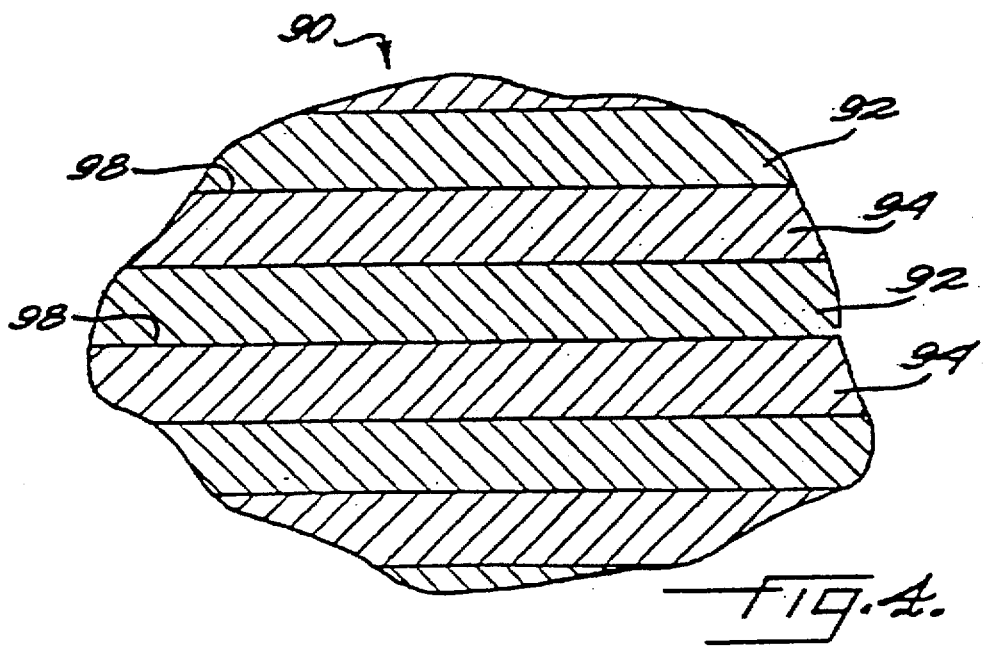
FIG. 4 is a partial cross-sectional view of a thermoelectric generation configuration according to another preferred embodiment of the present invention.

In FIG. 4, illustrating another preferred embodiment of the present invention, a thermoelectric device 90 is configured so that a first conductor 92, preferably a superconducting material, and a second material 94 that conducts heat efficiently, such as a semiconductor, are formed into wafers and the two conductors 92, 94 are interleaved so that the surfaces of the two conductors engage. Typically, the surfaces of conductors 92, 94 will have the same surface area so as to maximize the contact boundary formed between conductors 92, 94, when they are placed into contact with one another. This configuration of thermoelectric device 90 has a tremendous amount of surface area 98 between the wafers of first conductor 92 and the wafers of second conductor 94. This configuration of thermoelectric device 90 will not totally eliminate energy losses, but greatly reduces them, thus improving the efficiency of thermoelectric device 90.

In use, a thermoelectric device according to the present invention, such as devices 10 and 50, is used to convert heat energy to electrical energy. Heat source 20 and heat sink 22 are connected to the appropriate conductors 12 and 14 by thermally conducting connecting means 26 and 28, thereby producing a temperature gradient within a specified temperature range across boundary 18. The electrical potential established by the temperature gradient is proportional to the magnitude of the temperature gradient. Electrical connections 30 and 34 are then used as a means for extracting the established electrical potential. Since at least one of conductors 12 and 14 is made of material that has substantially no electrical resistance when used within the specified temperature range, that is, below the critical temperature of the superconducting material, the produced electrical potential is extracted without significant resistive loss.

Referring now to FIG. 2, thermoelectric device 50 is used to convert heat energy to electrical energy. A heat source and a heat sink are put into thermal contact (preferably, immediate contact) with hot shoe 52 and cold shoes 62 and 66, respectively, thereby producing a temperature gradient within a specified temperature range across the boundaries between first conducting material 82 and second conducting material 84 (see FIG. 3), located within conductor configurations 58 and 60. The electrical potential established by the temperature gradient is related to the magnitude of the temperature gradient. Electrical connections 74 and 76 are then used as a means for extracting the established electrical potential. Since at least one of conductors 82 and 84 is made of material that has substantially no electrical resistance when used within the specified temperature range, the produced electrical potential is extracted without significant resistive loss.

The operating temperature range of superconductors varies depending on the material. Current materials operate only at very cold temperatures, such as those found in outer space or in special, controlled environments. Some materials have critical temperatures on the order of 100 K; for example, $YBa_2Cu_3O_7$ has a critical temperature of approximately 90° K. Other materials are superconducting at higher temperatures, and materials that are superconducting at room temperature are being developed. Materials suitable for use with the present invention include superconductors having critical temperatures greater than the boiling point of hydrogen (about 20 K), more preferably, those with critical temperatures greater than the boiling point of nitrogen (about 77 K).

Once again, it has been shown that by forming a substantial boundary between the two conductors, a superconducting thermoelectric generator having superior efficiency results. This substantial boundary is formed by maximizing the contact boundary between conductors by either making the two conductors have the same length and the contact boundary have a length equal to that conductor length or making the two conductors have the same surface area and the contact boundary have a surface area equal to that conductor surface area.

It will be apparent to those skilled in the art that many changes and substitutions can be made to the preferred embodiment herein described without departing from the spirit and scope of the present invention as defined by the appended claims.

That which is claimed:

1. A device for producing electricity, comprising:

a pair of thermoelectric materials, said pair comprising a conductor and a semiconductor;

said conductor having a length and a critical temperature, said conductor conducting electricity substantially without resistance when the temperature of said conductor is less than said critical temperature;

said semiconductor having a length substantially equal to that of said conductor and touching said conductor so as to maximize an overlap between said semiconductor and said conductor, said overlap defining a substantial boundary between said conductor and said semiconductor;

a heat sink in thermal contact with said conductor; and a heat source in thermal contact with said semiconductor, said heat source and said heat sink maintaining a first temperature in said conductor and a second temperature in said semiconductor, said first temperature being less than said critical temperature so that said conductor conducts electricity substantially without resistance, said second temperature being higher than said first temperature so that a temperature gradient is established across substantially the entirety of said boundary, said temperature gradient resulting in an electrical potential between said conductor and said semiconductor.

2. The device as recited in claim 1, wherein said semiconductor has a higher thermal conductivity than said conductor.

3. The device as recited in claim 1, wherein said semiconductor has a critical temperature, said semiconductor conducting electricity substantially without resistance when said second temperature is less than said critical temperature of said semiconductor.

4. The device as recited in claim 1, wherein said conductor further comprises an array of discrete, spaced-apart elements electrically connected and encased in said semiconductor.

5. The device as recited in claim 1, wherein said conductor is carried as a dopant by said semiconductor.

6. The device as recited in claim 1, wherein said conductor and said semiconductor are each formed into wafers and said wafers of said conductor are interleaved with said wafers of said semiconductor.

7. The device as recited in claim 1, wherein said critical temperature of said conductor is greater than or equal to 77 K.

8. The device as recited in claim 1, wherein said conductor is made of $RBa_2Cu_3O_x$, where R is at least one rare earth metal and x is a finite number.

9. A device for producing electricity, said device comprising:

a pair of thermoelectric materials, said pair comprising a first conductor and a second conductor;

said first conductor having a length and a first superconducting temperature range, said first conductor conducting electricity substantially without resistance when the temperature of said first conductor is within said first superconducting temperature range;

said second conductor having a length substantially equal to the length of said first conductor and in thermal contact with said first conductor, said second conductor contiguous to said first conductor so as to maximize an overlap between said first conductor and said second conductor, said overlap defining a substantial boundary between said first and second conductors said second conductor being made of a material having a higher thermal conductivity than said first conductor;

a heat sink thermally connected to said first conductor for maintaining said first conductor at a first temperature within said first predefined range;

a heat source thermally connected to said second conductor for holding said second conductor at a second temperature higher than said first temperature so that a temperature gradient is established across substantially the entirety of said boundary, whereby an electrical potential difference exists between said first and said second conductors; and means in electrical connection with said first and said second conductors for extracting said electrical potential difference.

10. The device as recited in claim 9, wherein said second conductor is a semiconductor.

11. The device as recited in claim 9, wherein said first conductor further comprises an array of electrically connected discrete, spaced-apart elements encased in said second conductor, and wherein said extracting means further comprises bus means for connecting said elements together electrically.

12. The device as recited in claim 9, wherein said second conductor is a semiconductor, and wherein said first conductor is uniformly doped onto said second conductor.

13. The device as recited in claim 9, wherein said first conductor and said second conductor are formed into wafers, and said wafers of said first conductor are interleaved with said wafers of said second conductor.

14. The device as recited in claim 9, wherein said second conductor has a second superconducting temperature range, said second conductor conducting electricity substantially without resistance when the temperature of said second conductor is within said second superconducting temperature range, said heat source holding said second temperature of said second conductor within said second superconducting temperature range.

15. The device as recited in claim 9, wherein said first conductor is made of $RBa_2Cu_3O_x$, where R is at least one rare earth metal and x is a finite number.

16. The device as recited in claim 9, wherein said first conductor is $[La_{1-x}M_x]_2CuO_4$, where M is Ba, Sr, or Ca and $0 \leq x \leq 1$, and wherein said second conductor is $La_2CuO_4$.

17. A method for producing electricity from a pair of thermoelectric materials, said pair comprising a first conductor and a second conductor, said first conductor having a length and said second conductor having a length substantially equal to the length of said first conductor, said first conductor having a first critical temperature, said first conductor conducting electricity substantially without resistance when the temperature of said first conductor is less than said first critical temperature, said method comprising the steps of:

placing said first conductor in contact with said second conductor so as to maximize an overlap between said first conductor and said second conductor, said overlap defining a substantial boundary between said first and second conductors;

adjusting the temperature of said first conductor to a first temperature, said first temperature being less than said first critical temperature; and adjusting the temperature of said second conductor to a second temperature, said second temperature being different from said first temperature so that a temperature gradient is established across substantially the entirety of said boundary, whereby a potential difference is established between said first and said second conductors so that an electrical potential exists across said first and said second conductors.

18. The method as recited in claim 17, wherein said second conductor has a second critical temperature, said second conductor conducting electricity substantially without resistance when the temperature of said second conductor is less than said second critical temperature, further comprising the step of adjusting said second temperature to a value less than said second critical temperature.

19. The method as recited in claim 17, wherein said first conductor is an array of discrete electrically connected, spaced-apart elements, further comprising the steps of:

encasing said elements of first conductor in said second conductor.

20. The method as recited in claim 17, further comprising the step of extracting said potential difference.

21. A method for producing electricity from a pair of thermoelectric materials, said pair comprising a first conductor and a second conductor, said first conductor having a planar surface area and said second conductor having a planar surface area substantially equal to the surface area of said first conductor, said first conductor having a first critical temperature, said first conductor conducting electricity substantially without resistance when the temperature of said first conductor is less than said first critical temperature, said method comprising the steps of:

placing said first conductor in contact with said second conductor so as to maximize an overlap between said first conductor and said second conductor, said overlap defining a substantial boundary between said first and second conductors, said boundary having a planar surface area substantially equal to that of said first and second conductors;

adjusting the temperature of said first conductor to a first temperature, said first temperature being less than said first critical temperature; and adjusting the temperature of said second conductor to a second temperature, said second temperature being different from said first temperature so that a temperature gradient is established across substantially the entirety of said boundary, whereby a potential difference is established between said first and said second conductors so that an electrical potential exists across said first and said second conductors.

* * * * *